| (12) | United States Patent | (10) Patent No.: | US 11,575,058 B2 |
|---|---|---|---|
| | Inoue | (45) Date of Patent: | Feb. 7, 2023 |

(54) SOLAR POWER GENERATOR, SOLAR ARRAY WING, AND SPACE STRUCTURE

(71) Applicant: Mitsubishi Electric Corporation, Chiyoda-ku (JP)

(72) Inventor: Akira Inoue, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/611,913

(22) PCT Filed: Jun. 30, 2017

(86) PCT No.: PCT/JP2017/024146
§ 371 (c)(1),
(2) Date: Nov. 8, 2019

(87) PCT Pub. No.: WO2019/003415
PCT Pub. Date: Jan. 3, 2019

(65) Prior Publication Data
US 2021/0151619 A1    May 20, 2021

(51) Int. Cl.
*H01L 31/05* (2014.01)
*H02S 10/40* (2014.01)
*B64G 1/44* (2006.01)

(52) U.S. Cl.
CPC .......... *H01L 31/0508* (2013.01); *B64G 1/443* (2013.01); *H02S 10/40* (2014.12)

(58) Field of Classification Search
CPC .............. H01L 31/035281; H01L 31/05–0516
See application file for complete search history.

(56) References Cited

U.S. PATENT DOCUMENTS

| 6,248,950 B1 | 6/2001 | Hoeber et al. |
| 2003/0029494 A1 | 2/2003 | Ohkubo |
| (Continued) | | |

FOREIGN PATENT DOCUMENTS

| DE | 60 2006 000 394 T2 | 1/2009 |
| JP | 62-95617 | 5/1987 |
| (Continued) | | |

OTHER PUBLICATIONS

International Search Report dated Aug. 15, 2017 in PCT/JP2018/024146 filed on Jun. 30, 2017.
(Continued)

*Primary Examiner* — Ryan S Cannon
(74) *Attorney, Agent, or Firm* — Oblon, McClelland, Maier & Neustadt, L.L.P.

(57) ABSTRACT

In a solar power generator, a plurality of first solar cell strings (51) are formed in a way that, in each first solar cell string (51), two or more first solar cells (41) are connected in series and disposed in descending order of potential, with an end narrower in width facing one end (E1) in a first direction (D1), from another end (E2) in the first direction (D1). A plurality of second solar cell strings (52) are formed in a way that, in each second solar cell string (52), two or more second solar cells (42) are connected in series and (Continued)

disposed in descending order of potential, with an end wider in width facing the one end (E1) in the first direction (D1), from the another end (E2) in the first direction (D1). Each of the plurality of first solar cell strings (51) and each of the plurality of second solar cell strings (52) are aligned alternately along the second direction (D2) that is orthogonal to the first direction (D1).

5 Claims, 9 Drawing Sheets

(56) References Cited

U.S. PATENT DOCUMENTS

| | | | |
|---|---|---|---|
| 2011/0232733 A1 | 9/2011 | Noemayr et al. | |
| 2011/0232773 A1 | 9/2011 | Noemayr et al. | |
| 2012/0298200 A1* | 11/2012 | Niggemann | H01L 27/301 |
| | | | 136/258 |
| 2014/0305485 A1* | 10/2014 | Kuramoto | H01L 31/0504 |
| | | | 136/244 |
| 2015/0194551 A1 | 7/2015 | Crist et al. | |
| 2016/0087132 A1 | 3/2016 | Alteneiji | |
| 2016/0293669 A1* | 10/2016 | Issa | H01L 27/301 |
| 2018/0019352 A1* | 1/2018 | D'Abrigeon | H01L 31/042 |
| 2018/0076761 A1* | 3/2018 | Rehder | H01L 31/0516 |
| 2018/0097133 A1 | 4/2018 | Anthony et al. | |
| 2018/0358496 A1* | 12/2018 | Payan | H01L 31/022433 |
| 2020/0357940 A1 | 11/2020 | Anthony et al. | |

FOREIGN PATENT DOCUMENTS

| | | |
|---|---|---|
| JP | 11-274542 A | 10/1999 |
| JP | 2009-43872 A | 2/2009 |
| JP | 2011-211199 A | 10/2011 |
| JP | 2012-89577 A | 5/2012 |
| WO | WO 02/054501 A1 | 7/2002 |
| WO | 2016/042480 A1 | 3/2016 |
| WO | 2017/019308 A1 | 2/2017 |

OTHER PUBLICATIONS

Japanese Office Action dated Apr. 28, 2020 in Patent Application No. 2019-526092 (with English translation), 9 pages.
International Search Report dated Aug. 15, 2017 in PCT/JP2017/024146 filed on Jun. 30, 2017.
German Office Action issued in German Patent Application No. 112017007700.1 dated Jul. 1, 2022, (w/ English translation).
German Office Action issued in German Patent Application No. 11 2017 007 700.1 dated Sep. 26, 2022, (w/ English Translation).

* cited by examiner

Fig.9

SOLAR POWER GENERATOR, SOLAR ARRAY WING, AND SPACE STRUCTURE

TECHNICAL FIELD

The present invention relates to a solar power generator, a solar array wing, a space structure, and a method for manufacturing the solar power generator.

BACKGROUND ART

So far, many spacecraft carrying solar panels have been launched into outer space. As a spacecraft becomes more sophisticated, a solar panel capable of supplying a large amount of power becomes necessary. Accordingly, it is becoming necessary to increase an output voltage of the solar panel. In general, a solar panel is configured by arranging a plurality of solar cell strings parallel to one another, and electrically connecting adjacent end parts of the solar cell strings adjacent to each other to one another by an inter-column connector. Each solar cell string is configured of series of solar cells connected in series. Therefore, a connection part of the solar cell strings adjacent to each other is a turnaround part of the series of solar cells connected in series. As the output voltage of the solar panel becomes higher, a potential difference between such connection parts becomes larger. And, with generated power of a solar cell being an energy source, discharge is more likely to occur between the solar cells.

In Patent Literature 1, as a measure to prevent the discharge between the solar cells, a solar panel where an insulation material such as an RTV adhesive and so on are filled in a gap between the solar cells and used as an insulating barrier is described. "RTV" is an abbreviation for Room Temperature Vulcanizing.

CITATION LIST

Patent Literature

Patent Literature 1: JP H11-274542 A

SUMMARY OF INVENTION

Technical Problem

In the solar panel described in Patent Literature 1, there is an issue that weight increases for the amount of the adhesive used as an insulation barrier. There is also an issue that the cost increases due to an increase in material cost of the adhesive, an operation cost for installing the insulation barrier, an increase in a rocket launching fee due to weight increase, and so on.

It is possible to prevent the discharge between the solar cells without installing the insulation barrier if distance between the solar cells adjacent to each other are made as long as possible. If, however, the distance between the solar cells is made longer, mounting efficiency of the solar cell on the solar panel decreases. As a result, the output voltage of the solar panel decreases.

The present invention aims to prevent the discharge between the solar cells without installing the insulation barrier and to increase the mounting efficiency of the solar cell.

Solution to Problem

A solar power generator according to one aspect of the present invention includes:

a plurality of first solar cell strings formed in a way that, in each first solar cell string, two or more solar cells, both ends within each solar cell having different widths, are connected in series and disposed in descending order of potential, with an end narrower in width of each solar cell facing one end in a first direction, from another end in the first direction; and a plurality of second solar cell strings formed in a way that, in each second solar cell string, two or more solar cells, both ends within each solar cell having different widths, are connected in series and disposed in descending order of potential, with an end wider in width of each solar cell facing the one end in the first direction, from the another end in the first direction, each of the plurality of second solar cell strings being aligned alternately with each of the plurality of first solar cell strings along a second direction that is orthogonal to the first direction.

Advantageous Effects of Invention

According to the present invention, both a potential difference and an interval between solar cells adjacent to each other along a second direction can be made smaller. Therefore, discharge between the solar cells can be prevented without installing an insulation barrier, and mounting efficiency of the solar cell can be improved.

DESCRIPTION OF EMBODIMENTS

An embodiment of the present invention will be described hereinafter with reference to the drawings. Throughout the drawings, the same or corresponding parts are denoted by the same reference numerals. In the description of the embodiments, description of the same or corresponding parts will be omitted or simplified as appropriate. Note that the present invention is not limited to the embodiment to be described hereinafter, and various modifications are possible as necessary. For example, the embodiment to be described hereinafter may be partially implemented.

First Embodiment

The present embodiment will be described with reference to FIGS. 1 to 9.

Description of Configuration

Figure 1:
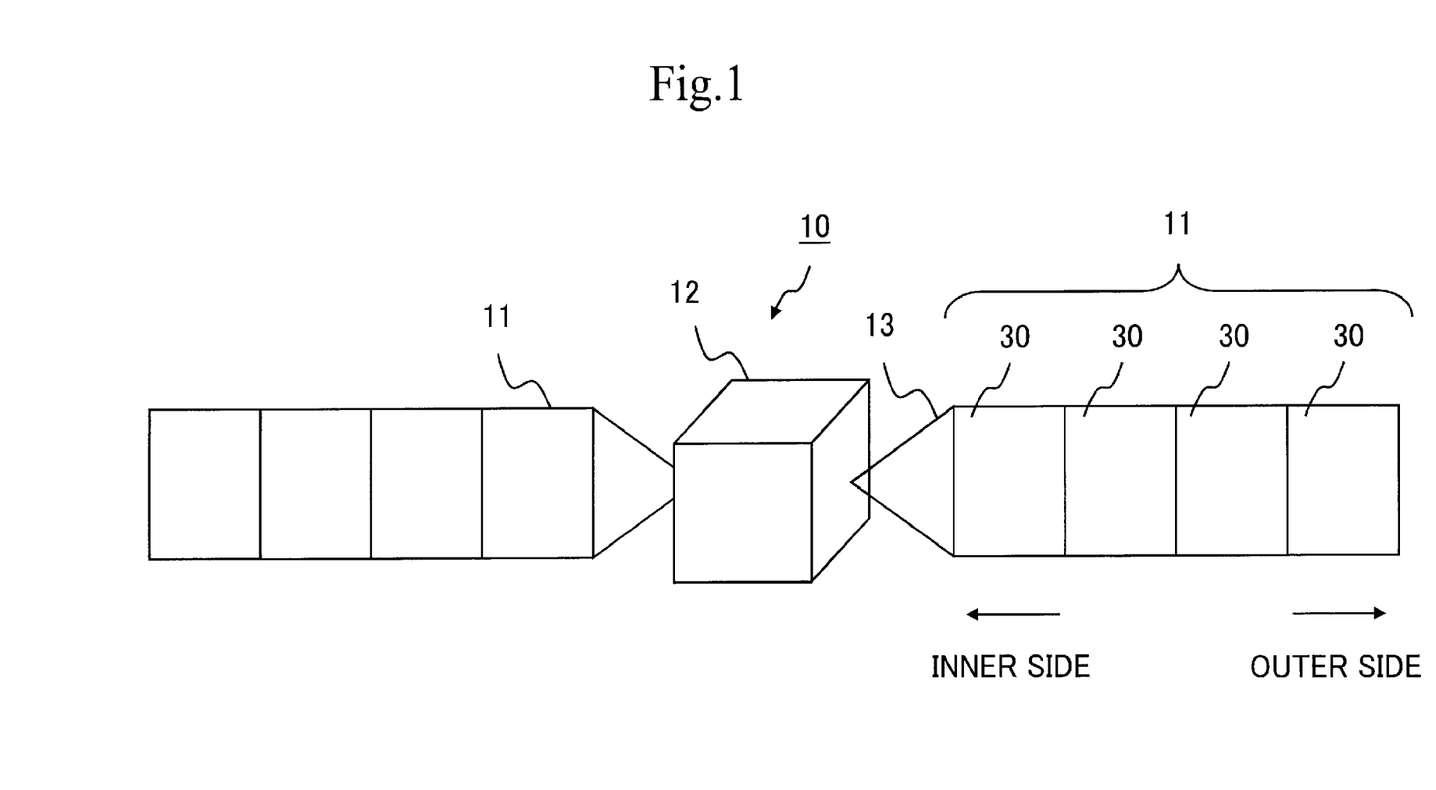
FIG. 1 is a schematic diagram of a space structure according to a first embodiment.

The configuration of a space structure 10 according to the present embodiment will be described with reference to FIGS. 1 and 2.

The space structure 10 is a satellite in the present embodiment, but may be a space structure of another kind such as a space station.

The space structure 10 includes a pair of solar array wings 11 and a structure body 12.

The abbreviation for "solar array wing" is SAW. In the present embodiment, the solar array wing 11 is connected to both sides of the structure body 12 by a yoke 13.

Each solar array wing 11 includes a plurality of solar power generators 30 connected to one another. Four of the solar power generators 30 are included in the present embodiment where two or more thereof may be included in the "plurality of solar power generators 30". In the present embodiment, the four of the solar power generators 30 are connected in a straight line along the direction of expansion of the solar array wing 11.

Each solar power generators 30 is a solar panel in the present embodiment. Each solar power generator 30 is configured such that a solar cell 16 is mounted on the front and wiring 17 is mounted on the back of a support 31. The support 31 has a structure in which a honeycomb core 14 made of aluminum is sandwiched between face sheets 15 made of carbon fiber reinforced plastic. The abbreviation for "carbon fiber reinforced plastic" is CFRP. Note that the material of the honeycomb core 14 is not limited to aluminum, but may be formed of other materials such as carbon or the like.

The abbreviation for "solar cell" is SC. The lower surface of the solar cell 16 is stuck on the front surface of the support 31 with an adhesive 18. The upper surface of the solar cell 16 is covered with protective cover glass 19. The solar cells 16 adjacent to each other are electrically connected to each other by an interconnector 20.

In the present embodiment, the wiring 17 is a cable formed of a copper wire or another core wire that is coated, but may be wiring of another kind such as a blanket with a copper foil pattern embedded therein or the like.

The structure body 12 is a satellite bus in the present embodiment. The structure body 12 is connected to one side of the support 31 of one of the plurality of solar power generators 30. The "one of the plurality of solar power generators 30" is the closest to the structure body 12 and thus corresponds to the innermost solar power generator 30.

In the present embodiment, two types of solar cells 16 with a reversed electrode arrangement are used.

Figure 3:
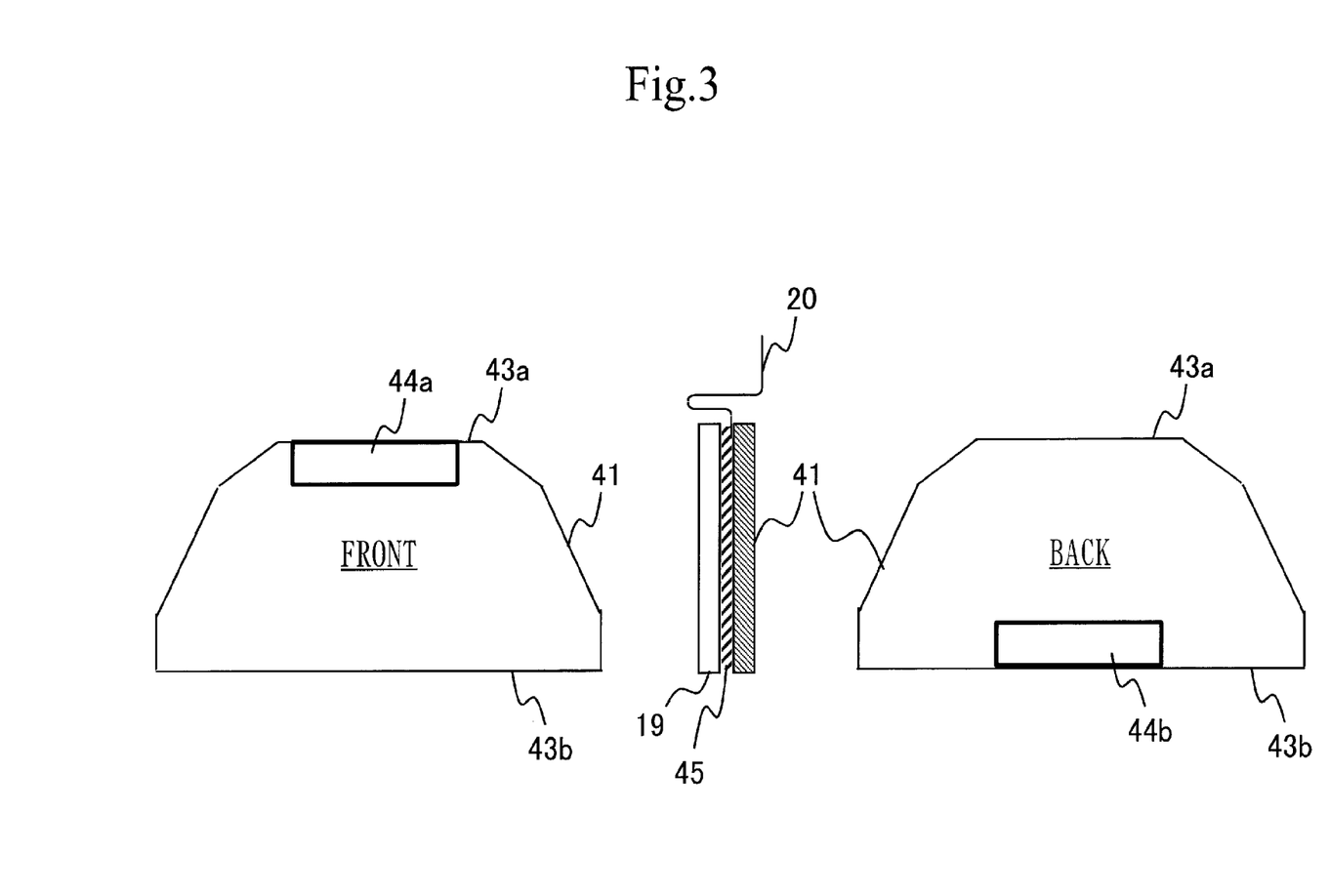
FIG. 3 is a diagram illustrating the front, a cross-section, and the back of a first type of solar cell according to the first embodiment.

The configuration of a first solar cell 41 which is a first type of solar cell 16 will be described with reference to FIG. 3.

A shape of the first solar cell 41 may be in any shape with different widths at both ends 43a and 43b, but a shape approximate a semicircle is desirable, and the shape in the present embodiment is in an octagonal shape approximate a semicircle.

An electrode 44a is provided on the front of the first solar cell 41. The electrode 44a on the front is arranged on the end 43a of the first solar cell 41 narrower in width. An electrode 44b is provided on the back of the first solar cell 41. The electrode 44b on the back is arranged on the end 43b of the first solar cell 41 wider in width.

On the first solar cell 41, a current flows from the electrode 44b on the back to the electrode 44a on the front. One end of the interconnector 20 is connected to the electrode 44a on the front. Another end of the interconnector 20 is connected to the electrode 44b on the back of another first solar cell 41. The interconnector 20 and each electrode may be connected in any method, but are connected by welding in the present embodiment.

The cover glass 19 is stuck on the front of the first solar cell 41 by an adhesive 45.

Figure 4:
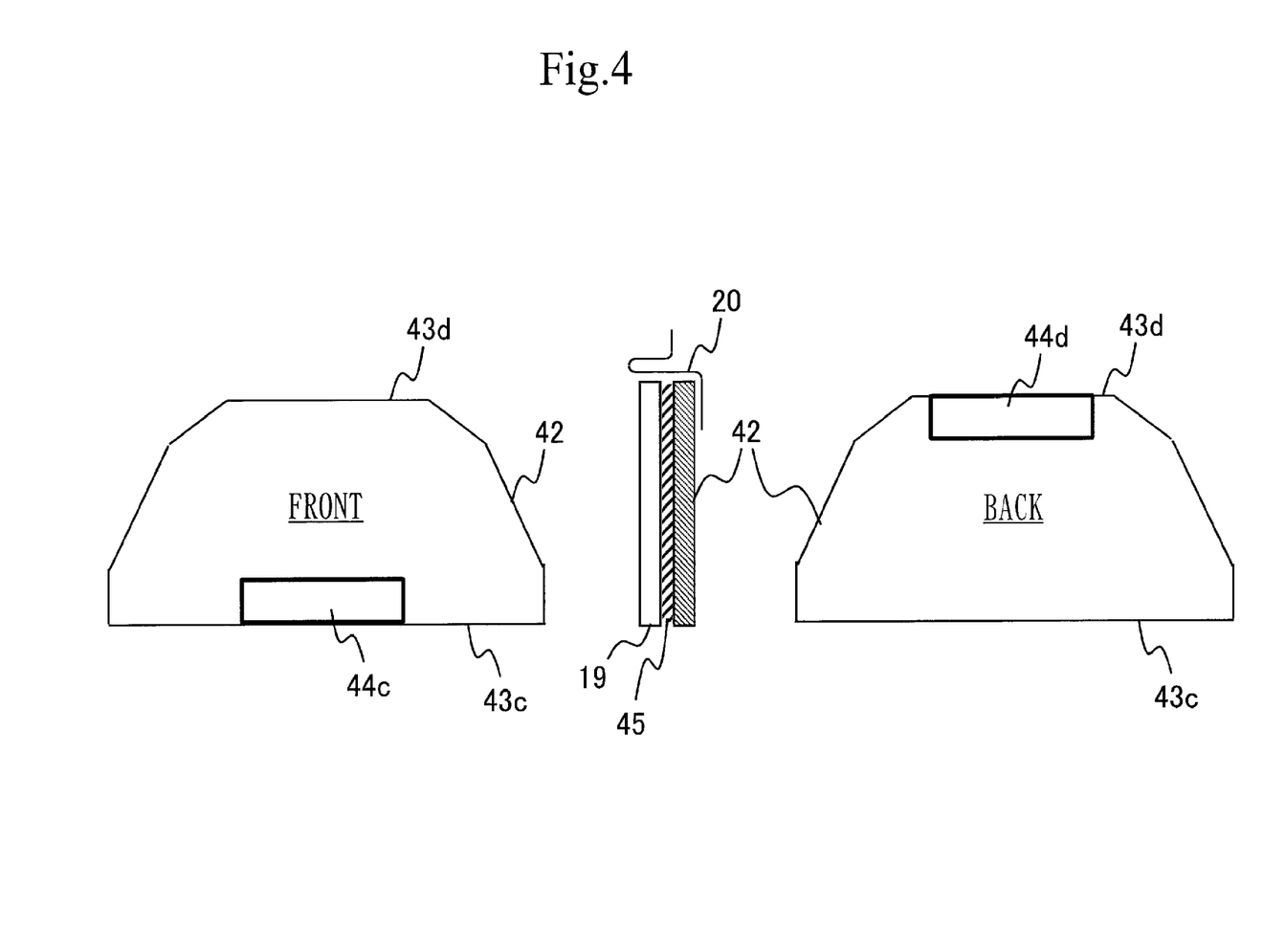
FIG. 4 is a diagram illustrating the front, a cross-section, and the back of a second type of solar cell according to the first embodiment.

A configuration of a second solar cell 42 which is a second type of solar cell 16 will be described with reference to FIG. 4.

A shape of the second solar cell 42 may be in any shape with different widths at both ends 43c and 43d, but a shape approximate a semicircle is desirable, and the shape in the present embodiment is in an octagonal shape approximate a semicircle. The shape of the second solar cell 42 may differ from the shape of the first solar cell 41, but in the present embodiment, the shape is the same as the shape of the first solar cell 41. A size of the second solar cell 42 may differ from a size of the first solar cell 41, but in the present embodiment, the size is the same as the size of the first solar cell 41.

An electrode 44c is provided on the front of the second solar cell 42. The electrode 44c on the front is arranged on the end 43c of the second solar cell 42 wider in width. An electrode 44d is provided on the back of the second solar cell 42. The electrode 44d on the back is arranged on the end 43d of the second solar cell 42 narrower in width.

On the second solar cell 42, as with the current on the first solar cell 41, a current flows from the electrode 44d on the back to the electrode 44c on the front. One end of the interconnector 20 is connected to the electrode 44d on the back. Other end of the interconnector 20 is connected to the electrode 44c on the front of another second solar cell 42. As described above, the interconnector 20 and each electrode may be connected in any method, but are connected by welding in the present embodiment.

The cover glass 19 is stuck on the front of the second solar cell 42 by the adhesive 45.

Note that the first solar cell 41 and the second solar cell 42 may be replaced by one type of solar cell 16 where two electrodes 44a and 44c are provided on the front and two electrodes 44b and 44d are provided on the back. By selectively using one of the electrodes 44a and 44c on the front and selectively using one of the electrodes 44b and 44d on the back, both the first solar cell 41 and the second solar cell 42 can be substituted by this type of solar cell 16. Specifically, by using the electrode 44a on the front and the electrode 44b on the back, substituting the first solar cell 41 is possible. By using the electrode 44c on the front and the electrode 44d on the back, substituting the second solar cell 42 is possible.

Figure 5:
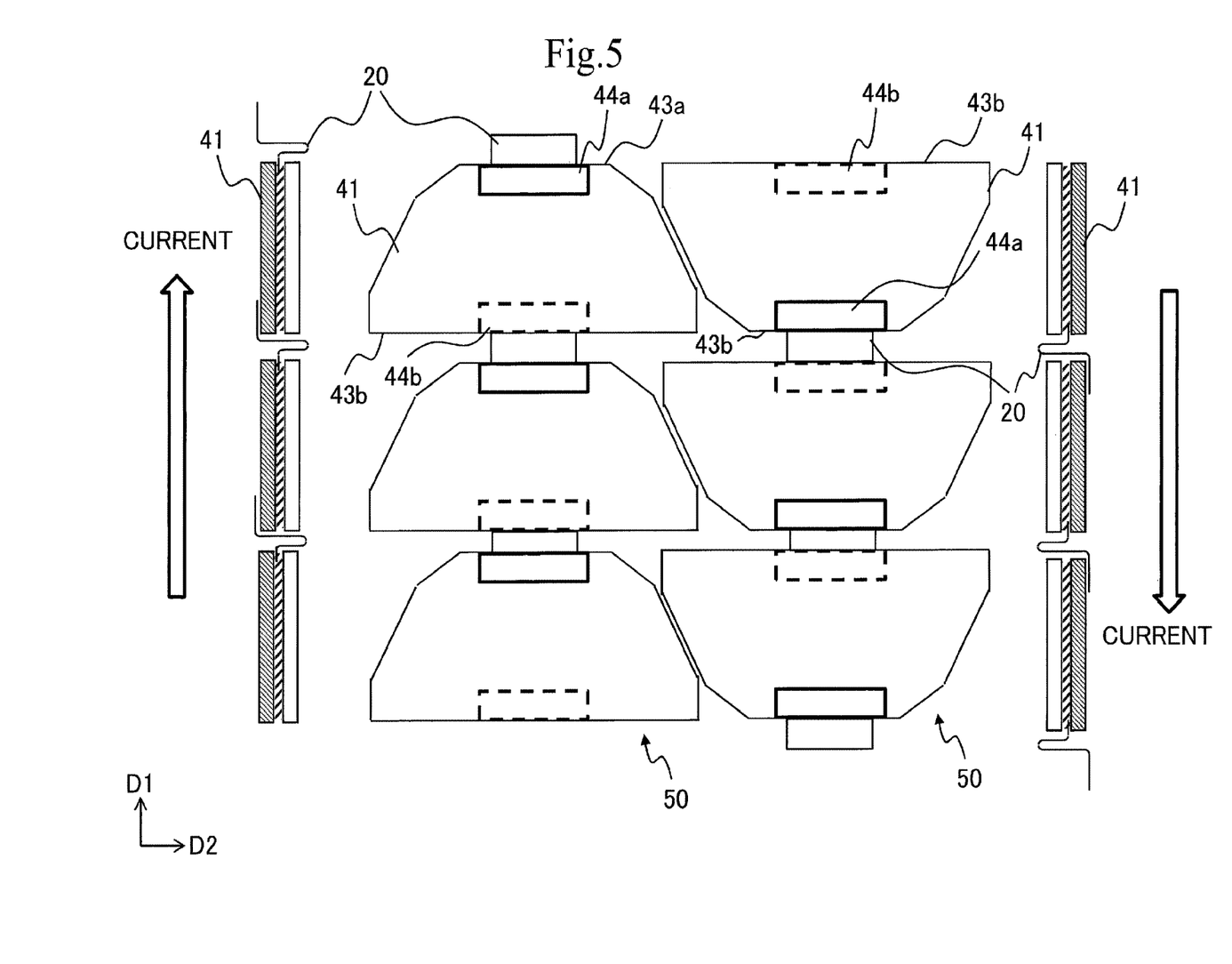
FIG. 5 is a diagram illustrating the front and a cross-section of a type of group of solar cell strings according to a comparative example.

A configuration of a type of group of solar cell strings according to a comparative example will be described with reference to FIGS. 5 and 6.

A plurality of solar cell strings 50 are used in the comparative example.

The plurality of solar cell strings 50 are formed in a way that, in each solar cell string 50, the two or more first solar cells 41 are connected in series and disposed in descending order of potential, with the end 43a narrower in width facing one end E1 in a first direction D1, from another end E2 in the first direction D1. The number of first solar cells 41 included in one solar cell string 50 is eight. That is, in the comparative example, each solar cell string 50 is formed in a way that the end 43a on each first solar cell 41 narrower in width is facing the one end E1 in the first direction D1, and the eight first solar cells 41 connected in series are disposed in descending order of potential from the another end E2 in the first direction D1.

Each of the plurality of solar cell strings 50 is aligned along a second direction D2 that is orthogonal to the first direction D1.

As described above, on each first solar cell 41, the current flows from the electrode 44b on the back to the electrode 44a on the front. Therefore, among the first solar cells 41 adjacent to each other on the same solar cell string 50, the electrode 44a on the front of the first solar cell 41 with higher potential and the electrode 44b on the back of the first solar cell 41 with lower potential are connected by the interconnector 20.

If a direction of the first solar cells 41 adjacent to each other in the second direction D2 is reversed, the first solar cell 41 in an octagonal shape approximate a semicircle can be arranged so that a space between the first solar cells 41 is minimized. The direction of the flow of current, however, is reversed between the solar cell strings 50 adjacent to each other in the second direction D2.

As a specific example, let a potential difference of one column of the solar cell string 50 be 1 nV. Assume that if the potential difference between connection parts of the solar cell strings 50 adjacent to each other exceeds 1 nV, discharge is more likely to occur. In the configuration in FIG. 6, the potential difference between the connection parts which is a turnaround part of the first solar cell 41 becomes 1 nV in two of three columns, and 2 nV in one of three columns. Therefore, to prevent discharge, it is necessary to either make distance between the first solar cells 41 adjacent to each other longer, or install an insulation barrier between the first solar cells 41 adjacent to each other.

Figure 6:
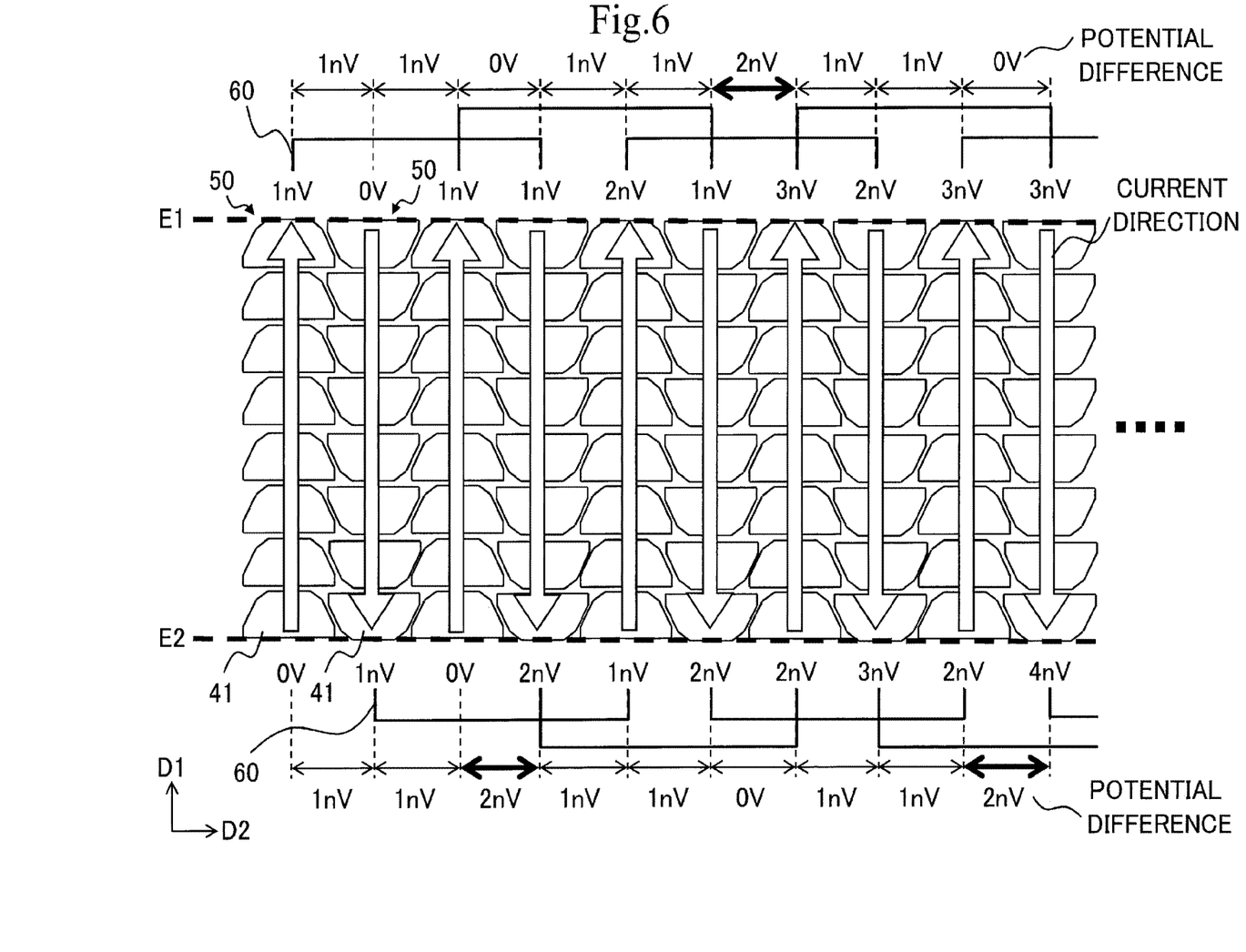
FIG. 6 is a diagram illustrating a current direction and a potential difference in the type of group of solar cell strings according to the comparative example.

In the example of FIG. 6, three columns being in one group, the solar cell strings 50 in the same column of two groups adjacent to each other are connected in series. Specifically, when i={1, 2, . . . } and j={1,2,3}, the solar cell string 50 in jth column in the ith group from the left, and the solar cell string 50 in the jth column in the i+1th group from the left are connected in series. For this connection, wiring 60 that connects the solar cell strings 50 on one end E1 side skipping two columns in between is provided, wiring 60 that connects the solar cell strings 50 on another end E2 side shifting one column to the right and skipping two columns in between is provided, wiring 60 that connects the solar cell strings 50 on the one end E1 side shifting one further column to the right and skipping two columns in between is provided, and similar wiring 60 is provided from here onwards.

The solar cell strings 50 in the first column of each group, the solar cell strings 50 in the second column of each group, and the solar cell strings 50 in the third column of each group are connected in parallel with one another. The number of parallel solar cell strings 50 in the present example is three and the number may be determined as appropriate depending on a current value requested. That is, the maximum value of j may be determined to a number that satisfies the current value requested, not limiting to three.

Figure 7:
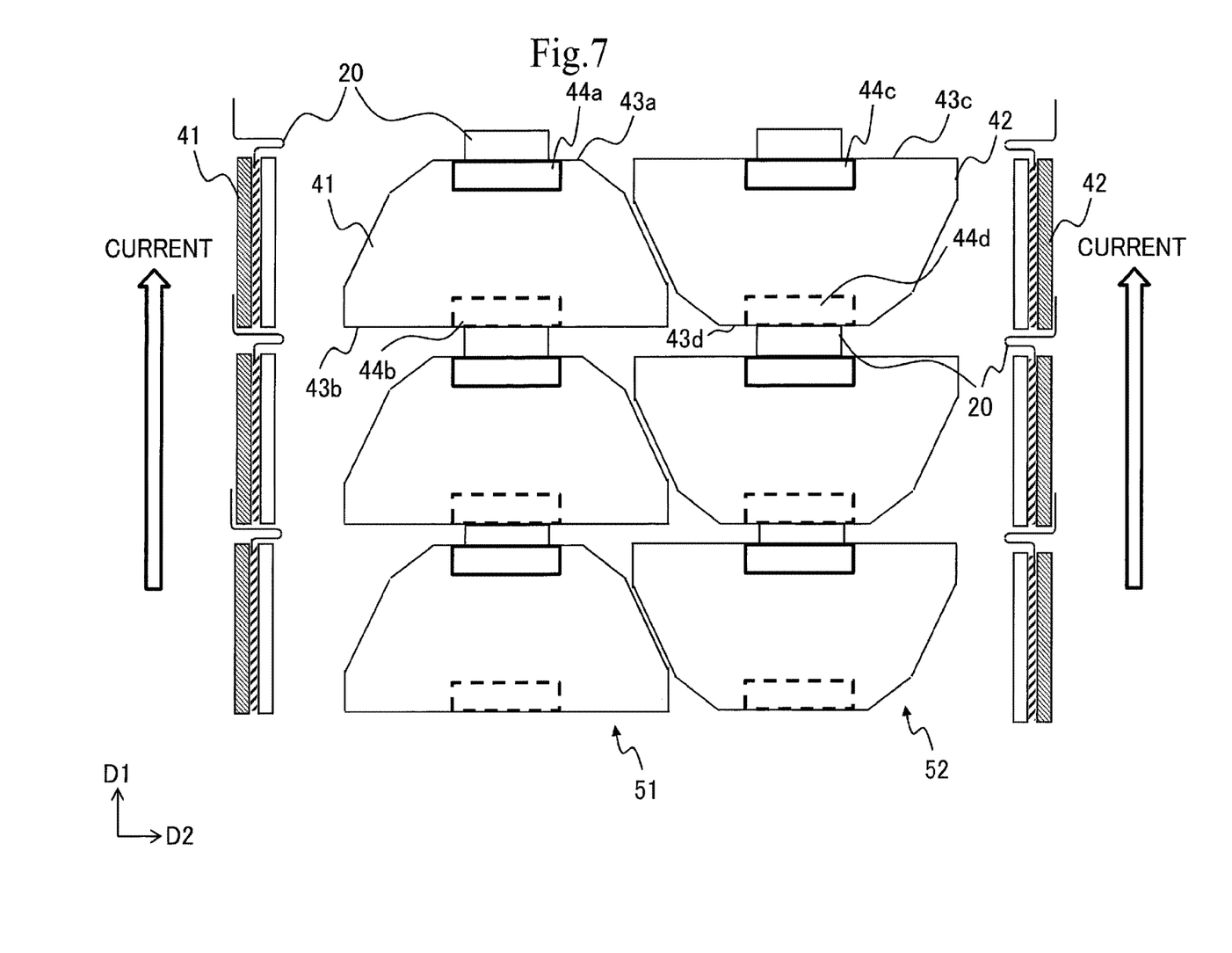
FIG. 7 is a diagram illustrating the front and a cross-section of two types of groups of solar cell strings according to the first embodiment.

A configuration of two types of groups of solar cell strings according to the present embodiment will be described with reference to FIGS. 7 and 8.

In the present embodiment, each solar power generator 30 includes the two types of groups of solar cell strings which are a plurality of first solar cell strings 51 and a plurality of second solar cell strings 52.

The plurality of first solar cell strings 51 are formed in a way that, in each first solar cell string 51, the two or more first solar cells 41 are connected in series and disposed in descending order of potential, with the end 43a narrower in width facing the one end E1 in the first direction D1, from the another end E2 in the first direction D1. The number of first solar cells 41 included in one first solar cell string 51 may be any number, but the number is eight in the present embodiment. That is, in the present embodiment, each first solar cell string 51 is formed in a way that the end 43a on each first solar cell 41 narrower in width is facing the one end E1 in the first direction D1, and the eight first solar cells 41 connected in series are disposed in descending order of potential from the another end E2 in the first direction D1.

The plurality of second solar cell strings 52 are formed in a way that, in each second solar cell string 52, the two or more second solar cells 42 are connected in series and disposed in descending order of potential, with the end 43c wider in width facing the one end E1 in the first direction D1, from the another end E2 in the first direction D1. The number of second solar cells 42 included in one second solar cell string 52 may be any number, but in the present embodiment, the number is eight. That is, in the present embodiment, each second solar cell string 52 is formed in a way that the end 43c on each second solar cell 42 wider in width is facing the one end E1 in the first direction D1, and the eight second solar cells 42 connected in series are disposed in descending order of potential from the another end E2 in the first direction D1.

Each of the plurality of first solar cell strings 51 and the plurality of second solar cell strings 52 are aligned alternately along the second direction D2 that is orthogonal to the first direction D1. That is, assuming that one first solar cell string 51 is arranged in the first column, the first solar cell string 51 should be arranged in the odd column and the second solar cell string 52 should be arranged in the even column. Assuming that one second solar cell string 52 is arranged in the first column, the first solar cell string 51 should be arranged in the even column and the second solar cell string 52 should be arranged in the odd column.

As described above, on each first solar cell 41, the current flows from the electrode 44b on the back to the electrode 44a on the front. Therefore, among the first solar cells 41 adjacent to each other on the same first solar cell string 51, the electrode 44a on the front of the first solar cell 41 with higher potential and the electrode 44b on the back of the first solar cell 41 with lower potential are connected by the interconnector 20.

As described above, on each second solar cell 42, as with the current on the first solar cell 41, the current flows from the electrode 44d on the back to the electrode 44c on the front. Therefore, among the second solar cells 42 adjacent to each other on the same second solar cell string 52, the electrode 44c on the front of the second solar cell 42 with higher potential and the electrode 44d on the back of the second solar cell 42 with lower potential are connected by the interconnector 20.

As described above, in the present embodiment, as with the comparative example, among the solar cells 16 adjacent to each other on the same solar cell string, an electrode on the front of the solar cell 16 with higher potential and an electrode on the back of the solar cell 16 with lower potential are connected by the interconnector 20.

If a direction of the solar cells 16 adjacent to each other in the second direction D2 is reversed, the solar cell 16 in an octagonal shape approximate a semicircle can be arranged so that a space between the solar cells 16 is minimized. As described above, in the present embodiment, different from the comparative example, two types of solar cells 16 with a reversed electrode arrangement are to be used. As a result, the direction that the current flows between the solar cell strings adjacent to each other in the second direction D2 can be made the same. Specifically, the direction that the current flows can be unified to a direction of flow from the another end E2 to the one end E1 in the first direction D1.

As a specific example, let a potential difference of one column of a solar cell string be 1 nV. Assume that if a potential difference between the connection parts of the solar cell strings adjacent to each other exceeds 1 nV, discharge is more likely to occur. In the configuration of FIG. 8, the potential difference between the connection parts which is a turnaround part of the solar cell 16 is 0V in two of three columns, and 1 nV in one of three columns. Therefore, to prevent discharge, there is no need to make distance between the solar cells 16 adjacent to each other longer or install an insulation barrier between the solar cells 16 adjacent to each other.

As described above, in the present embodiment, a space made between the first solar cell 41 and the second solar cell 42 along the second direction D2 can be narrowed and installation of the insulation barrier in the space can be omitted.

Figure 8:
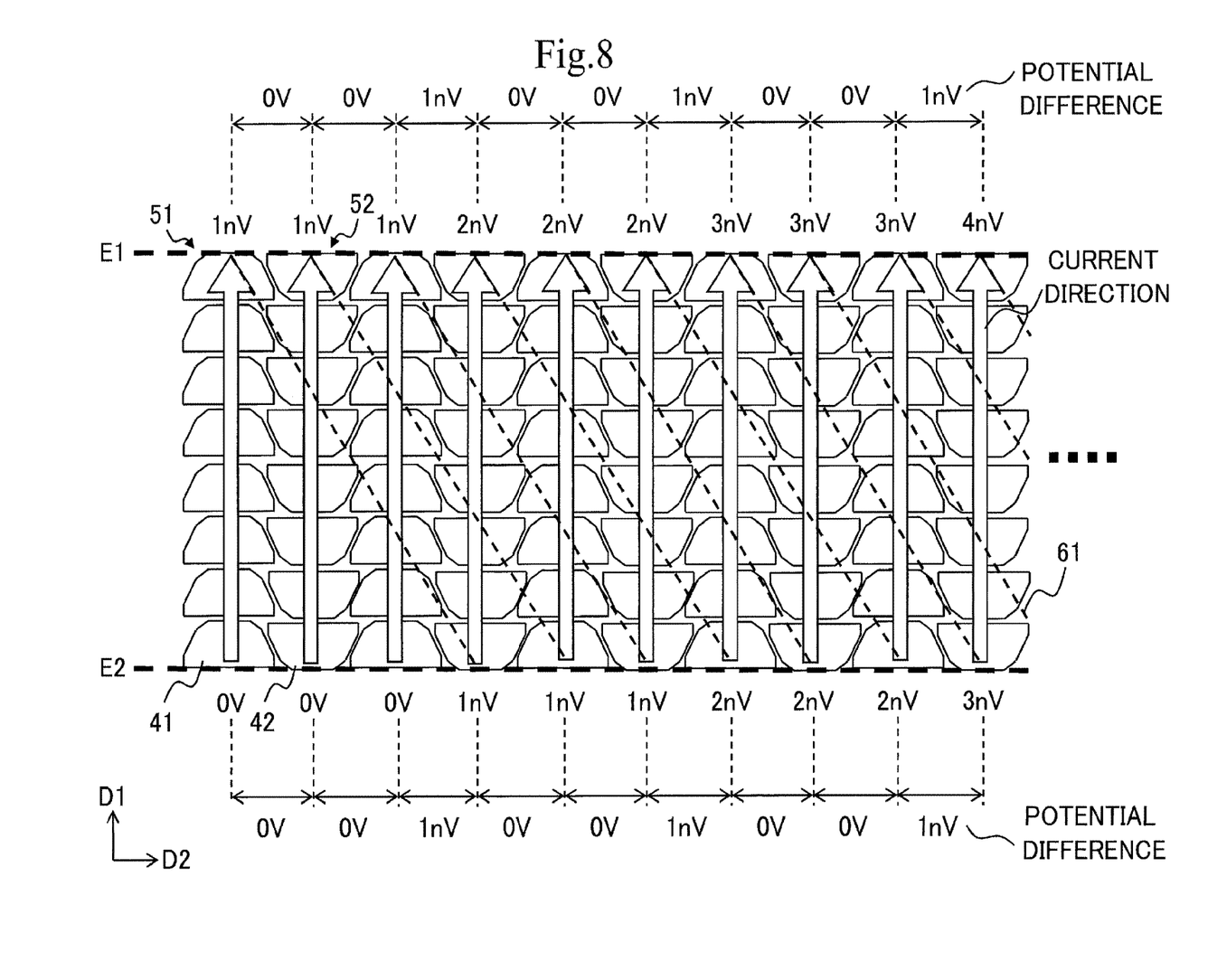
FIG. 8 is a diagram illustrating a current direction and a potential difference of the two types of groups of solar cell strings according to the first embodiment.

In the example of FIG. 8, as with the example of FIG. 6, three columns being in one group, the solar cell strings in the same column of two groups adjacent to each other are connected in series. Specifically, when i={1,2, . . . } and k={1,2,3}, the solar cell string in kth column in the ith group from the left, and the solar cell string in the kth column in the i+1th group from the left are connected in series. For this connection, on a back side of the support 31, wiring 61 that extends from the one end E1 side to the another end E2 side and connects the solar cell strings skipping two columns in between is provided, wiring 61 that extends from the one end E1 side to the another end E2 side shifting one column to the right that connects the solar cell strings skipping two columns in between is provided, and similar wiring 61 is provided from here onwards.

The solar cell strings in the first column of each group, the solar cell strings in the second column of each group, and the solar cell strings in the third column of each group are connected in parallel with one another. The number of parallel solar cell strings in the present example is three and the number may be determined as appropriate depending on the current value requested. That is, the maximum value of k may be determined to a number that satisfies the current value requested, not limiting to three.

A method for manufacturing the solar power generator 30 according to the present embodiment will be described.

There are at least the following four steps.

In the first step, from a plurality of wafers circular in shape, two solar cells 16 with different widths at both ends are created per wafer. From every wafer, two first solar cells 41 may be created, two second solar cells 42 may be created, or one first solar cell 41 and one second solar cell 42 may be created.

In the second step, the plurality of first solar cell strings 51 are formed in a way that, in each first solar cell string 51, the two or more first solar cells 41 created in the first step are connected in series and disposed in descending order of potential, with the end 43a narrower in width facing the one end E1 in the first direction D1, from the another end E2 in the first direction D1.

In the third step, the plurality of second solar cell strings 52 are formed in a way that, in each second solar cell string 52, the two or more second solar cells 42 created in the first step are connected in series and disposed in descending order of potential, with the end 43c wider in width facing the one end E1 in the first direction D1, from the another end E2 in the first direction D1.

In the fourth step, each of the plurality of first solar cell strings 51 obtained in the second step and each of the plurality of second solar cell strings 52 obtained in the third step are aligned alternately along the second direction D2.

Description of Effect of Embodiment

In the present embodiment, both the potential difference and an interval between the solar cells 16 adjacent to each other along the second direction D2 can be made smaller. Therefore, discharge between the solar cells 16 can be prevented without installing an insulation barrier and mounting efficiency of the solar cell 16 can be improved. As a result, the solar power generator 30 that is lightweight, low cost, highly reliable, and capable of supplying large amount of power can be provided.

Other Configurations

Figure 2:
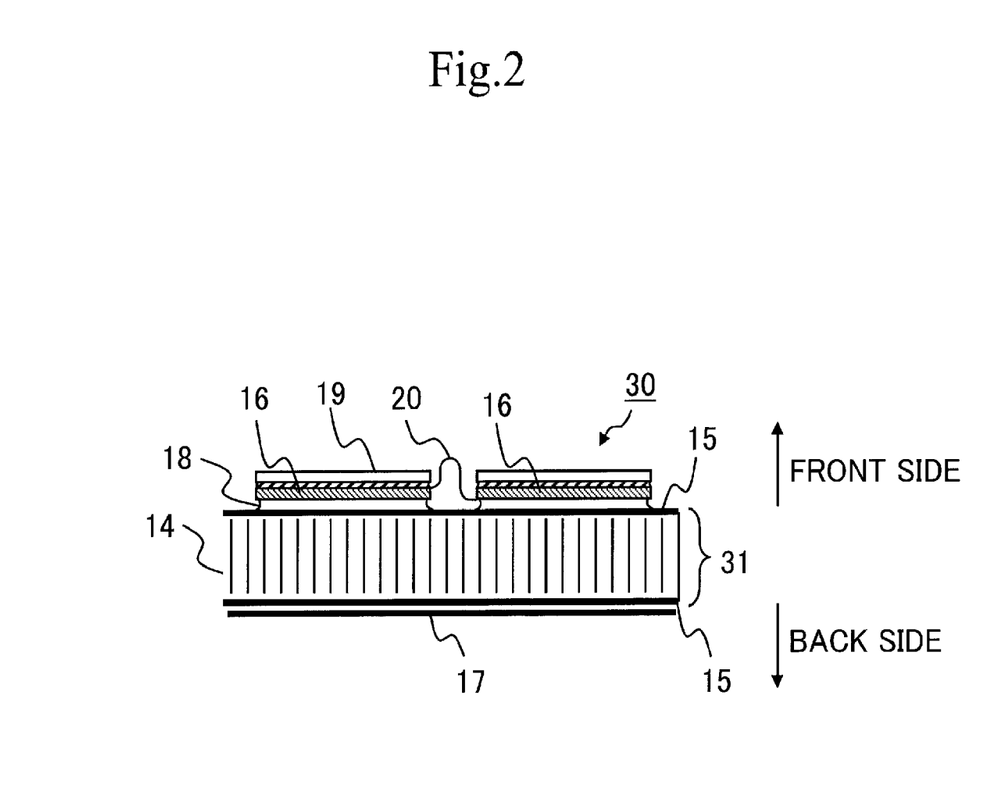
FIG. 2 is a cross-sectional view of a part of a solar power generator according to the first embodiment.
Figure 9:
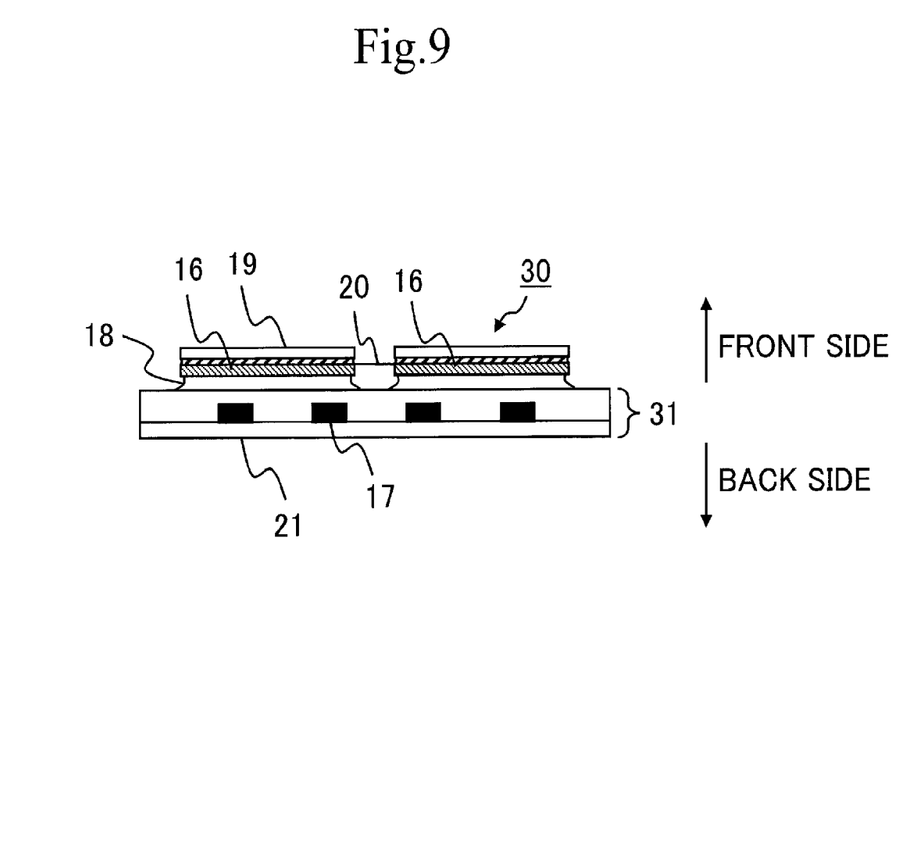
FIG. 9 is a cross-sectional view of a part of a solar power generator according to a variation of the first embodiment.

In the present embodiment, as illustrated in FIG. 2, each solar power generator 30 is configured as a solar panel, but as a variation as illustrated in FIG. 9, each solar power generator 30 may be configured as a solar array blanket.

In the present variation, each solar power generator 30 is configured by mounting the solar cell 16 on the front of the support 31 that has a structure in which the wiring 17 is sandwiched between polyimide films 21.

As for the solar cell 16, being the same as the solar cell 16 described above, the description will be omitted.

The wiring 17 is, specifically, a copper foil pattern.

In the present variation also, both the potential difference and the interval between the solar cells 16 adjacent to each other along the second direction D2 can be made smaller. Therefore, discharge between the solar cells 16 can be prevented without installing an insulation barrier and mounting efficiency of the solar cell 16 can be improved.

REFERENCE SIGNS LIST

10: space structure, 11: solar array wing, 12: structure body, 13: yoke, 14: honeycomb core, 15: face sheet, 16: solar cell, 17: wiring, 18: adhesive, 19: cover glass, 20: interconnector, 21: polyimide film, 30: solar power generator, 31: support, 41: first solar cell, 42: second solar cell, 43a: end, 43b: end, 43c: end, 43d: end, 44a: electrode, 44b: electrode, 44c: electrode, 44d: electrode, 45: adhesive, 50: solar cell string, 51: first solar cell string, 52: second solar cell string, 60: wiring, 61: wiring, D1: first direction, D2: second direction, E1: one end, E2: another end.

The invention claimed is:

1. A solar power generator comprising:
a plurality of first solar cell strings formed in a way that, in each first solar cell string, two or more solar cells, both ends within each solar cell having different widths, are connected in series and disposed in descending order of potential, with an end narrower in width of each solar cell facing one end in a first direction, from another end in the first direction; and a plurality of second solar cell strings formed in a way that, in each second solar cell string, two or more solar cells, both ends within each solar cell having different widths, are connected in series and disposed in descending order of potential, with an end wider in width of each solar cell facing the one end in the first direction, from the another end in the first direction, wherein each of the plurality of second solar cell strings are respectively aligned alternately with each of the plurality of first solar cell strings along a second direction that is orthogonal to the first direction, wherein each of the two or more solar cells of the plurality of first solar cell strings is positioned immediately adjacent a respective two or more cells of the plurality of second solar cell strings in the second direction orthogonal to the first direction, wherein the solar cells included in the plurality of first solar cell strings are the solar cells where the electrode on the front is arranged only on the end narrower in width and the electrode on the back is arranged only on the end wider in width, and wherein the solar cells included in the plurality of second solar cell strings are the solar cells where the electrode on the front is arranged only on the end wider in width and the electrode on the back is arranged only on the end narrower in width.

2. The solar power generator according to claim 1, wherein
the solar cells included in the plurality of first solar cell strings and the plurality of second solar cell strings are the solar cells where a current flows from an electrode on the back to an electrode on the front, and among the solar cells adjacent to each other on a same solar cell string, the electrode on the front of the solar cell with higher potential and the electrode on the back of the solar cell with lower potential are connected by an interconnector.

3. The solar power generator according to claim 1, wherein
the solar cells included in the plurality of first solar cell strings and the plurality of second solar cell strings are all of a same shape and size.

4. A solar array wing comprising:
a plurality of solar power generators connected to one another, each of which is the solar power generator according to claim 1.

5. A space structure comprising:
the solar array wing according to claim 4; and
a structure body connected to one solar power generator of the plurality of solar power generators.

* * * * *